United States Patent [19]

Fujita

[11] 4,402,029
[45] Aug. 30, 1983

[54] PROTECTIVE CIRCUIT FOR OUTPUT TRANSFORMER-LESS CIRCUIT

[75] Inventor: Osamu Fujita, Chigasaki, Japan

[73] Assignee: Matsushita Electric Industrial Co., Ltd., Kadoma, Japan

[21] Appl. No.: 155,745

[22] Filed: Jun. 2, 1980

[30] Foreign Application Priority Data

Jun. 15, 1979 [JP] Japan .................................. 54-76142
Dec. 3, 1979 [JP] Japan ................................ 54-157124

[51] Int. Cl.³ .............................................. H02H 7/20
[52] U.S. Cl. ........................................ 361/90; 361/88; 361/86; 330/207 P
[58] Field of Search ....................... 361/90, 88, 89, 86, 361/98, 101; 330/207 P, 298; 358/190, 245; 340/660, 661, 662, 663

[56] References Cited

U.S. PATENT DOCUMENTS

| 3,835,412 | 9/1974 | Honda et al. | 361/88 X |
| 3,968,382 | 7/1976 | Tsurushima | 330/207 P X |
| 4,150,339 | 4/1979 | Sueyoshi et al. | 361/86 X |
| 4,173,739 | 11/1979 | Yoshida | 330/207 P |

*Primary Examiner*—Patrick R. Salce
*Attorney, Agent, or Firm*—Amster, Rothstein & Engelberg

[57] ABSTRACT

A protective circuit for a class B OTL circuit such as a vertical deflection circuit and a sound output circuit of a television set. The protective circuit comprises a first voltage comparator circuit having one input terminal applied with a detection signal in the form of an average voltage of an output signal of the OTL circuit and the other input terminal applied with a first reference voltage, and a second voltage comparator circuit having one input terminal applied with the detection signal and the other input terminal applied with a second reference voltage which is different from the first reference voltage. Either one of the voltage comparator circuits is operated when the output terminal of the OTL circuit is short-circuited to either the power supply voltage line or earth. A control circuit is operated by an output of the voltage comparator circuit to cut off output transistors of the OTL circuit so that the output transistors can be protected from being damaged by large currents due to the short-circuiting.

13 Claims, 8 Drawing Figures

PROTECTIVE CIRCUIT FOR OUTPUT TRANSFORMER-LESS CIRCUIT

The present invention relates to a protective circuit for a circuit comprised of a class B output transformer-less (hereinafter simply referred to as OTL) circuit and typically exemplified as a vertical deflection circuit of a television set or a sound output circuit of a television set and a stereo radio set.

A conventionally used television set incorporates a vertical deflection circuit comprised of a quasi-complementary class B OTL circuit and which is as shown in FIG. 1.

A vertical oscillator circuit 1 shown in block form in FIG. 1 receives at point a a vertical synchronizing signal as a trigger signal and produces at point b a vertical oscillation output pulse. A saw-tooth wave generator circuit 2, also illustrated in block form, is connected to receive the vertical oscillation output pulse and it produces at point c a voltage signal of a saw-tooth waveform which in turn is amplified at an output stage bias stabilizing circuit and pre-amplifier circuit which includes transistors $Q_1$ and $Q_2$ and a diode $D_1$. Also illustrated are an input coupling capacitor $C_1$, a constant current circuit 3 for supplying currents to the transistors $Q_1$ and $Q_2$, a reference bias circuit adapted to determine the output stage bias and which includes diodes $D_2$ and $D_3$ and resistors $R_1$ and $R_2$, a driver transistor $Q_3$, an NPN output transistor $Q_4$, an equivalent PNP transistor constituted by transistors $Q_5$ and $Q_6$ coupled in Darlington connection of which transistor $Q_5$ functions to invert the signal polarity and transistor $Q_6$ serves as an output transistor, diodes $D_4$ and $D_5$ adapted to compensate for the base-emitter forward voltages of the transistors $Q_4$ and $Q_5$, a deflection coil $L_1$, an output coupling capacitor $C_2$, a resistor $R_7$ which detects current flowing through the deflection coil $L_1$ and supplies a negative feedback signal to the saw-tooth wave generator circuit 2 for the purpose of improving the linearity of the saw-tooth waveform.

Negative feedback resistors $R_5$ and $R_6$ divide a voltage at point h i.e., an average voltage of the voltage appearing at output point or terminal g and supplies a DC negative feedback signal to the output stage bias stabilizing circuit. The operation of the circuit shown in FIG. 1 is well known in the art and will not be detailed. For details, one may refer to "A Jumbo IC for Vertical Deflection and Video Signal Processing Circuit in TV Receiver" IEEE Trans. Vol CE-24, January 1978.

With the circuit of the above construction, problems arise in the event that the output terminal g is either grounded or short-circuited to a power supply line at potential $V_{cc}$ accidentally. In the first place, consider that the output terminal g is short-circuited to earth. In such an event, voltage at point e, i.e., the base voltage of the transistor $Q_1$, takes earth potential and hence the transistor $Q_1$ is rendered very conductive while the transistor $Q_2$ being cut off so that the driver transistor $Q_3$ is turned off. Consequently, the emitter of the NPN output transistor $Q_4$ is placed into earth potential and its base is coupled to the power supply potential $V_{cc}$ via a resistor $R_3$, resulting in a large current flow in the NPN output transistor $Q_4$ and consequent abnormally large collector loss, abnormal heat generation and breakdown of the transistor $Q_4$.

Secondly, consider that the output terminal g is short-circuited to the power supply potential $V_{cc}$. In such an event, voltage at point e equals a division of the supply potential $V_{cc}$ by resistors $R_5$ and $R_6$ (approximately twice the normal operation voltage) and hence the transistor $Q_1$ is turned off with the transistor Q rendered deeply conductive. Consequently, the driver transistor $Q_3$ is also rendered deeply conductive with its collector (point f) rendered approximating earth potential so that the equivalent PNP transistor circuit consisting of transistors $Q_5$ and $Q_6$ is rendered deeply conductive to cause a large current to flow through the output transistor $Q_6$, resulting in abnormally large collector loss accompanied by abnormal heat generation and consequent breakdown of the output transistor $Q_6$.

A conventional countermeasure for the above disadvantages is employment of a protective circuit as shown in FIG. 2. FIG. 2 is mainly illustrative of the protective circuit and relevant circuit connections are similar to those of FIG. 1.

In describing the operation of the FIG. 2 circuit, a large current, which would pass through the output transistor $Q_4$ in the event of short-circuiting of the output terminal g to earth without the provision of the protective circuit, can be suppressed to a short-circuit current of $Ig \simeq V_{BE(Q7)}/R_8$, where $V_{BE(Q7)}$ is the base-emitter forward voltage of the transistor $Q_7$, because when voltage developing across a resistor $R_8$ connected between the emitter of transistor $Q_4$ and the output terminal g exceeds the base-emitter forward voltage of a protective transistor $Q_7$, the transistor $Q_7$ is turned on to bias the NPN output transistor $Q_4$ toward cut off. As a result, the NPN output transistor $Q_4$ can be prevented from being broken down by heat generation due to a large current flowing through transistor $Q_4$. In the event that the output terminal g is short-circuited to the power supply potential $V_{cc}$, on the other hand, a protective transistor $Q_8$ similarly acts to suppress current which flows through the output transistor $Q_6$.

In this manner, the protective circuit comprised of the sets of resistor $R_8$ and transistor $Q_7$ and resistor $R_9$ and transistor $Q_8$ protects the output transistors in the event that the output terminal is short-circuited either to earth or power supply potential $V_{cc}$, but this protective circuit has disadvantages as follows.

In the first place, the provision of the resistors $R_8$ and $R_9$ narrows the operation range of the output stage and as a result, a required output power cannot be obtained unless a large amount of current is passed through the load in the form of deflection coil $L_1$. Consequently, current from power supply increases and efficiency as defined by (output power)/(power consumption in power supply) is degraded.

In the second place, when the output terminal g is short-circuited either to earth or supply potential $V_{cc}$, although current $I \simeq V_{BE(Q7)}/R_8$ flows in the output transistor $Q_4$ and current $I \simeq V_{BE(Q8)}/R_9$ flows in the output transistor $Q_6$ as described above, these currents vary so extensively depending on irregularities in values of the resistors $R_8$ and $R_9$ and $V_{BE}$ that in some cases, the output transistors are broken down instantaneously.

In particular, the resistors $R_8$ and $R_9$ are required to have low resistances in order to maximize the operation range of the output stage. Furthermore, if constructed in the form of an integrated circuit, such resistors tend to be extensively irregular in resistance and in addition, irregularities in contact resistance at the junction between the resistor and aluminum wiring are added, thus aggravating irregularities as a whole.

The present invention contemplates elimination of the above drawbacks and has for its object to provide a protective circuit which can protect output transistors in an OTL circuit from being damaged by large currents.

According to the invention, a protective circuit for an OTL circuit comprises a first voltage comparator circuit having one input terminal applied with an average voltage of a vertical deflection output signal of the OTL circuit and the other input terminal applied with a first reference voltage, and a second voltage comparator circuit having one input terminal applied in common with the average voltage and the other input terminal applied with a second reference voltage which is different from the first reference voltage, at least one of the first and second voltage comparator circuits being operated when the output terminal of the OTL circuit is short-circuited to at least one of a power supply voltage line and an earth line so as to cut off output transistors in the OTL circuit, whereby the output transistors can be protected from being damaged by large currents.

Furthermore, during a transient period ranging from turning-on of the power supply to a time at which voltage on the power supply line reaches a stationary value, an erroneous operation of the voltage comparator circuits is prevented to assure smooth picture displays.

The present invention will be apparent from the following detailed description taken in conjunction with the accompanying drawings, in which.

Figure 1:
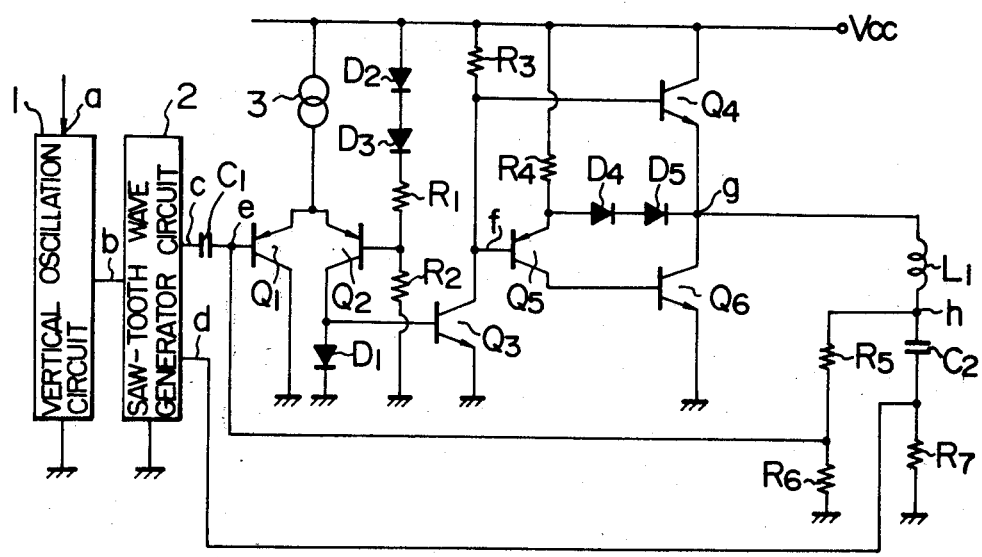
FIG. 1 is a circuit diagram of a prior art vertical deflection circuit.
Figure 3:
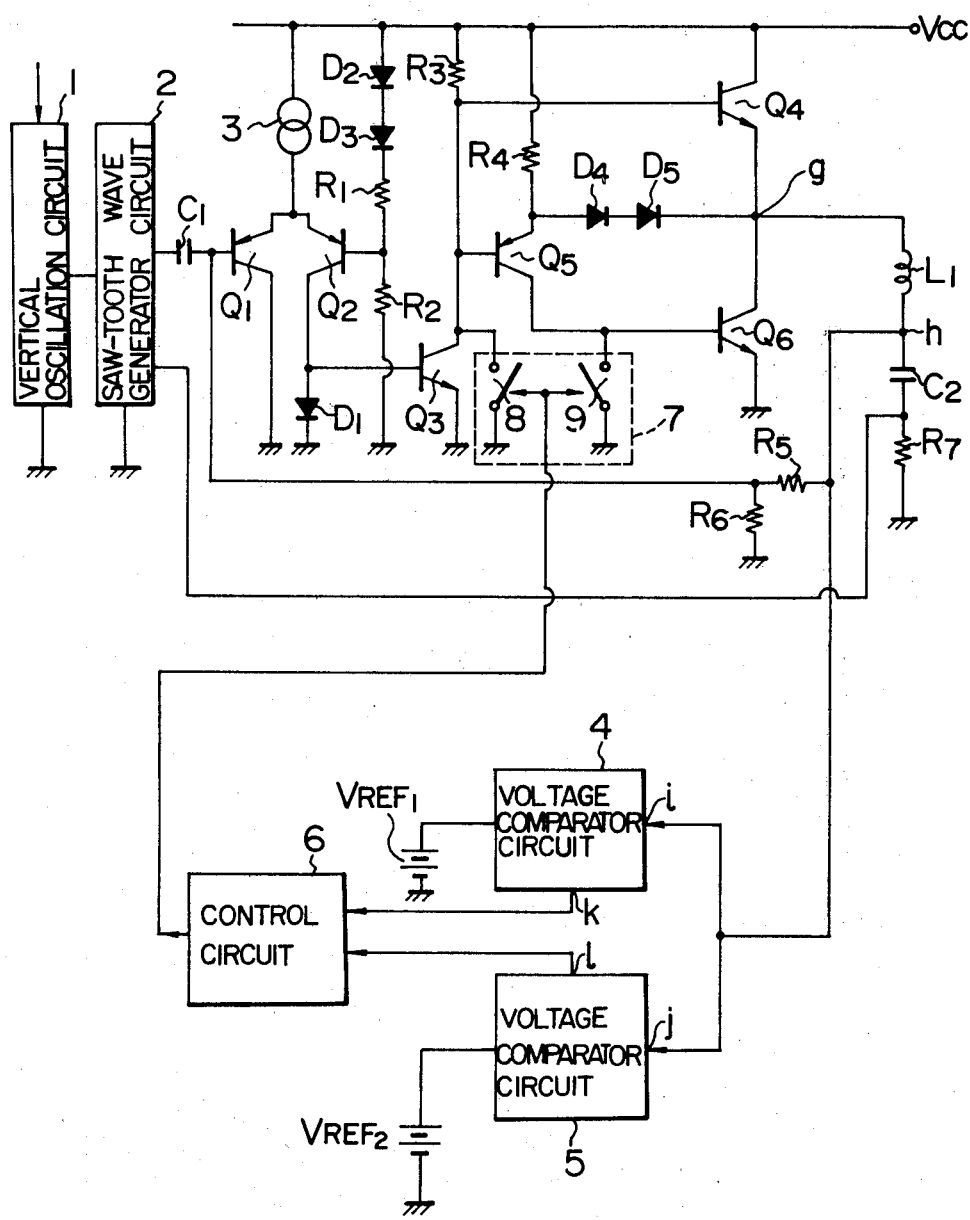
FIG. 3 is a block diagram showing a fundamental construction of a protective circuit embodying the invention as applied to an OTL circuit.

Referring now to FIG. 3, there is shown, in block form, a fundamental construction of a protective circuit according to the present invention applied to the same vertical deflection circuit as that of FIG. 1. The protective circuit featuring the invention is constituted by voltage comparator circuits 4 and 5, a control circuit 6, a switch circuit 7, and reference voltage sources of voltages $V_{REF1}$ and $V_{REF2}$.

The voltage comparator circuit 4 has two input terminals and compares a voltage applied to one input terminal i with a reference voltage $V_{REF1}$ applied to the other input terminal to produce a signal on an output terminal K. Similarly, the voltage comparator circuit 5 compares a voltage applied to one input terminal j with a reference voltage $V_{REF2}$ applied to the other input terminal to produce a signal on an output terminal l. Specifically, an average voltage of a vertical deflection output signal is applied to the input terminals i and j as a detection signal.

In operation, the voltage comparator circuit 4 produces an output signal on the output terminal k when the detection signal voltage applied to one input terminal i exceeds the reference voltage $V_{REF1}$. The voltage comparator circuit 5, on the other hand, produces an output signal on the output terminal l when the detection signal voltage applied to one input terminal j falls below the reference voltage $V_{REF2}$ applied to the other input terminal. The reference voltage $V_{REF1}$ for the voltage comparator circuit 4 is preset to lie between the power supply voltage $V_{cc}$ and the average output signal voltage appearing at point h between the deflection coil $L_1$ and the output coupling capacitor $C_2$ whereas the reference voltage $V_{REF2}$ for the voltage comparator circuit 5 is to lie between earth potential and the average output signal voltage at point h.

With this construction, in the event that the output terminal g is short-circuited to the power supply line for voltage $V_{cc}$, the voltage comparator circuit 4 operates to produce the output signal on the output terminal k whereas in the event of the output terminal g being short-circuited to earth, the other voltage comparator circuit 5 operates to produce the output signal on the output terminal l. The signal appearing on the output terminal k or l is transmitted to the control circuit 6 to cause it to produce an output signal which operates the switch circuit 7.

Switches 8 and 9 constituting the switch circuit 7 are then operated simultaneously to ground the collector of the driver transistor $Q_3$ and the collector of the polarity inverting transistor $Q_5$ in Darlington connection. With the collector of the driver transistor $Q_3$ grounded, one output transistor $Q_4$ is rendered cut off and with the collector of the polarity inverting transistor $Q_5$ grounded, the other output transistor $Q_6$ is rendered cut off. Consequently, when the output terminal g is short-circuited either to the power supply line for voltage $V_{cc}$ or to earth, either the voltage comparator circuit 4 or 5, the control circuit 6 and the switch circuit 7 operate to turn off either the output transistor $Q_4$ or $Q_6$, thereby protecting the same.

In the embodiment set forth hereinbefore, the detection signal in the form of the average voltage of vertical deflection output signal is advantageously used.

If the detection signal takes the form of an output signal on deflection output terminal g which varies between approximate earth potential and the power supply voltage $V_{cc}$, high accuracy is required for values of the reference voltage $V_{REF1}$ and $V_{REF2}$ which are important to detect the difference between the output terminal potential for normal operation and that for the short-circuiting of the output terminal to earth or to the power supply potential. Conversely, large irregularities in the values of the reference voltages $V_{REF1}$ and $V_{REF2}$ lead to erroneous operations. In consideration of such inconvenience, the average voltage of output signal appearing at point h is used as the detection signal in the present invention. The output signal at point h is nearly of a DC voltage and has a magnitude of about half the power supply voltage $V_{cc}$, distinctively differing from potentials of 0 (volt) and $V_{cc}$ (volt) which the output terminal g bears when short-circuited to earth and the power supply line, respectively. Accordingly, even when non-uniformity in voltage values in the reference voltages $V_{REF1}$ and $V_{REF2}$ exists more or less, the reference voltage $V_{REF1}$ and $V_{REF2}$ can be set at suitable values to prevent any erroneous operations. Moreover, even when the output terminal g is short-circuited not fully but through an impedance or the circuit operation becomes abnormal owing to damage or deterioration of component elements, it is possible to advantageously prevent a large current flow through the output transistors $Q_4$ and $Q_6$ and consequent damage of the same.

Figure 4:
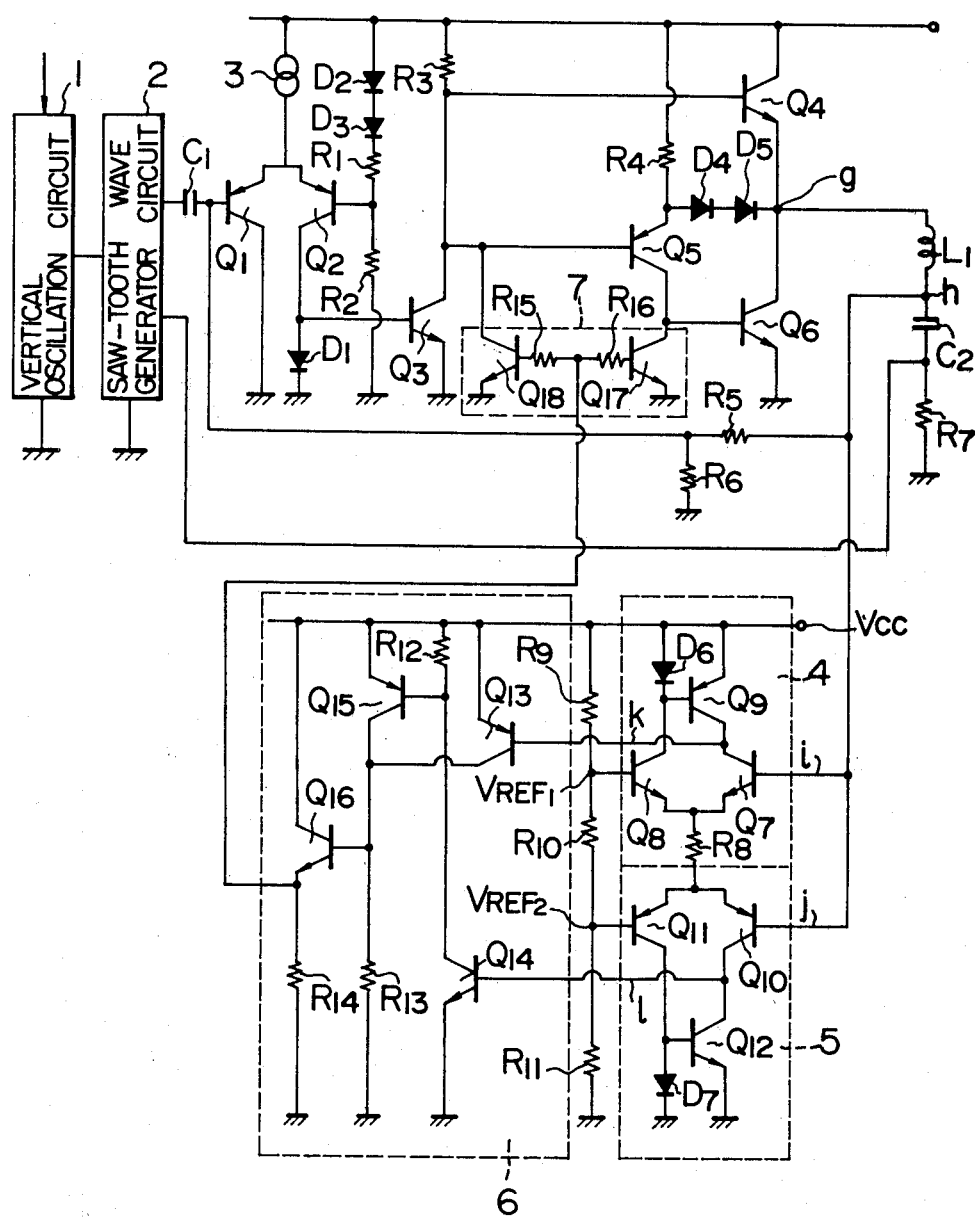
FIG. 4 is a circuit diagram showing details of the protective circuit shown in FIG. 3.

Details of the protective circuit of FIG. 3 will now be described by way of example as shown in FIG. 4 in which the same blocks as those in FIG. 3 are designated by the same reference numerals.

In FIG. 4, the voltage comparator circuit 4 comprises transistors $Q_7$, $Q_8$ and $Q_9$ and a diode $D_6$, the voltage comparator circuit 5 comprises transistors $Q_{10}$, $Q_{11}$ and $Q_{12}$ and a diode $D_7$, the reference voltage circuits for $V_{REF1}$ and $V_{REF2}$ comprises bias circuits which include resistors $R_9$, $R_{10}$ and $R_{11}$, the control circuit 6 comprises transistors $Q_{13}$, $Q_{14}$, $Q_{15}$ and $Q_{16}$ and resistors $R_{12}$, $R_{13}$ and $R_{14}$, and the switch circuit 7 comprises transistors $Q_{17}$ and $Q_{18}$ and resistors $R_{15}$ and $R_{16}$.

The circuit of FIG. 4 operates as follows. In normal operation, since the transistors $Q_7$ and $Q_{10}$ are turned off, the transistors $Q_8$ and $Q_9$ are turned on, and the transistors $Q_{11}$ and $Q_{12}$ are turned on, the transistors $Q_{13}$, $Q_{14}$, $Q_{15}$ and $Q_{16}$ are rendered cut off and the transistors $Q_{17}$ and $Q_{18}$ are also rendered cut off so that the vertical deflection circuit operates normally.

Now consider that the output terminal g of the vertical deflection circuit is grounded. Then, while the normal operation of the voltage comparator circuit 4 remains unchanged, the voltage comparator circuit 5 is inverted in operation. More particularly, voltage at point j equals earth potential with the transistor $Q_{10}$ turned on, the transistor $Q_{11}$ turned off, the transistor $Q_{12}$ turned off, the transistor $Q_{14}$ turned on, the transistors $Q_{15}$ and $Q_{16}$ turned on, and the transistors $Q_{17}$ and $Q_{18}$ of the switch circuit 7 turned on. As a result, the output transistors $Q_4$ and $Q_6$ are rendered cut off as described above to protect the same from being damaged by a large current flowing through these transistors.

Next, consider that the output terminal g is short-circuited to the power supply line for $V_{cc}$. Then, while the normal operation of the voltage comparator circuit 5 remains unchanged, the operation of the voltage comparator circuit 4 is inverted. More particularly, voltage at point i equals the $V_{cc}$ potential with the transistor $Q_7$ turned on, the transistors $Q_8$ and $Q_9$ turned off, the transistor $Q_{13}$ turned on, the transistor $Q_{16}$ turned on, and the transistors $Q_{17}$ and $Q_{18}$ of the switch circuit 7 turned on. As a result, the output transistors $Q_4$ and $Q_6$ are again protected from damage due to a large current flowing therethrough.

Figure 2:
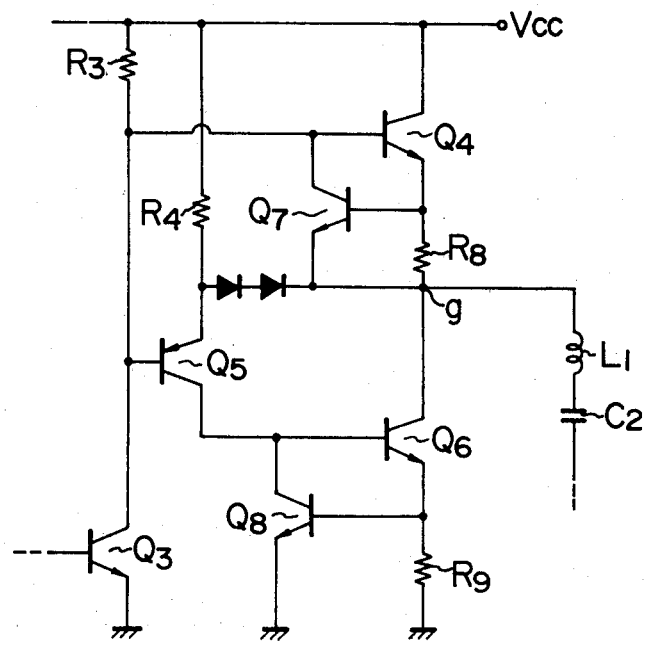
FIG. 2 is a circuit diagram of a prior art output stage protective circuit.

In this manner, the circuit of FIG. 4 can protect the output transistors $Q_4$ and $Q_6$ without narrowing the operation range of the output stage and without resort to flow of abnormal current as in FIG. 2.

The FIG. 4 circuit, however, is still disadvantageous in that it is accompanied by erroneous operations during a transient period ranging from turning-on of the power supply to a time at which voltage $V_{cc}$ on the power supply line reaches a stationary value.

Figure 5:
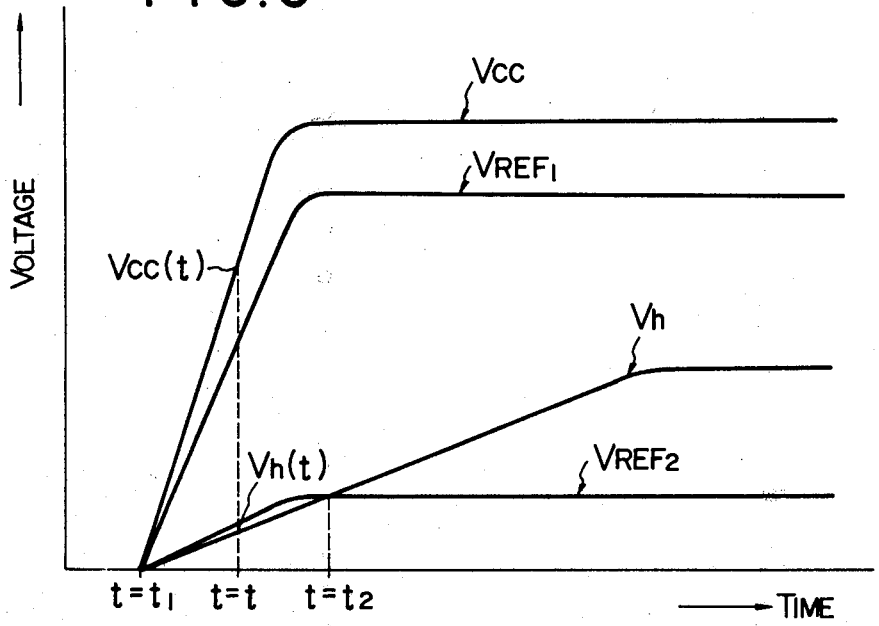
FIG. 5 is a graph useful in explaining the operation of the FIG. 4 circuit.

Transient voltages at various points are plotted in FIG. 5 where $V_h$ represents an average value voltage of the output signal appearing at junction h between the deflection coil $L_1$ and the output coupling capacitor $C_2$. As described above, when $V_{REF2} < V_h < V_{REF1}$, the voltage comparator circuits 4 and 5, the control circuit 6 and the switch circuit 7 will not operate whereas the transistor $Q_7$ of the voltage comparator circuit 4 is turned on when $V_{REF1} < V_h$ and the transistor $Q_{10}$ of the voltage comparator circuit 5 is turned on when $V_{REF2} > V_h$ so as to enable the subsequent control circuit 6 and switch circuit 7.

As will be seen from FIG. 5, $V_{REF2} > V_h$ is established during a period ranging from $t=t_1$ at which the power supply switch is turned on to $t=t_2$. This is because $V_{REF1}$ and $V_{REF2}$ are increased in proportion to an increasing slope of the power supply voltage $V_{cc}$ whereas the $V_h$ has a smaller increasing slope than that of the $V_{cc}$, $V_{REF1}$ and $V_{REF2}$ since the output coupling capacitor $C_2$ of a large capacitance is connected to point h and the negative feedback resistor $R_7$ has so a small resistance (usually 1 to 5 Ω) that the signal appearing at point g is integrated by an impedance of the deflection coil $L_1$ and the capacitance of the output coupling capacitor $C_2$.

Accordingly, for times t being between $t_1$ and $t_2$, the transistor $Q_{10}$ of the voltage comparator circuit 5 is turned on and the transistors $Q_{11}$ and $Q_{12}$ and diode $D_7$ are turned off. As a result, transistors of the control circuit 6 are turned on and the transistors $Q_{17}$ and $Q_{18}$ of the switch circuit 7 are also turned on to ensure that the base voltage of the output transistor $Q_4$ of the vertical deflection circuit equals the collector-emitter saturation voltage of the transistor $Q_{18}$ to thereby keep the emitter voltage of the output transistor $Q_4$ or the output voltage of the vertical deflection circuit at earth potential for times t between $t_1$ and $t_2$. During this period, therefore, no current is passed through the deflection coil $L_1$ and only one horizontal luminescent line is displayed on the screen of a cathode ray tube.

Without the protective circuit, as the power supply voltage $V_{cc}$ increases, the deflection current in proportion to the value of the $V_{cc}$ voltage is usually passed through the deflection coil $L_1$ and the size of picture display increases in approximate proportion to the $V_{cc}$ after turning-on of the power supply switch until it is stabilized at a given size. In contrast, with the protective circuit, an abnormal picture display is caused wherein the display of one horizontal luminescent line alone continues for times t between $t_1$ and $t_2$ and it is not before $t > t_2$ that a normal picture is displayed.

Figure 6:
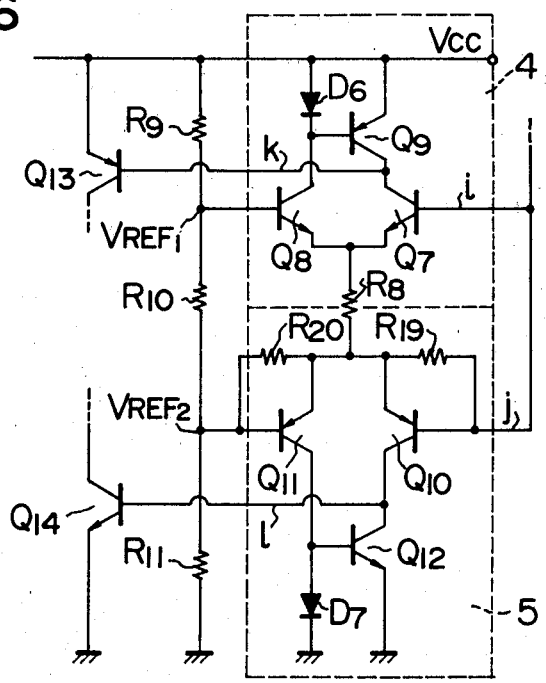
FIG. 6 is a circuit diagram showing details of a second embodiment protective circuit as applied to the OTL circuit.

A circuit of FIG. 6 is devised to eliminate such disadvantages as above. FIG. 6 shows only blocks corresponding to the voltage comparator circuits 4 and 5 with remaining components similar to those of FIG. 4 omitted.

In the FIG. 6 circuit, what is different from the FIG. 4 circuit is the provision of a resistor $R_{19}$ connected across the base-emitter of the transistor $Q_{10}$ and a resistor $R_{20}$ connected across the base-emitter of the transistor $Q_{11}$, these transistors constituting a differential amplifier for the voltage comparator circuit 5.

By virtue to the resistors $R_{19}$ and $R_{20}$ the transistor $Q_{10}$ and hence in turn the transistor $Q_{14}$ is prevented from being rendered on when $V_{REF2} > V_h$ for a time t between $t_1$ and $t_2$ shown in FIG. 5, but the protective operation against the short-circuiting of the output terminal can normally be effected after the power supply voltage $V_{cc}$ reaches a predetermined value. More particularly, for the time t between $t_1$ and $t_2$, current flowing through the resistor $R_8$ is by-passed through the resistor $R_{19}$ and terminal j to the output coupling capacitor $C_2$ and a voltage drop across the resistor $R_{19}$ is made smaller than a threshold voltage at which the transistor $Q_{10}$ is turned on so that the transistor $Q_{10}$ is kept turned off. On the other hand, for the stationary state operation, the value of the resistor 19 is so selected that the transistor $Q_{10}$ is turned on in the event that the output terminal g is accidentally short-circuited to earth.

The above conditions can be formulated as follows.

When, for a time t between $t_1$ and $t_2$, the power supply voltage $V_{cc}$ is $V_{cc}(t)$ and the average voltage $V_h$ is $V_h(t)$, the base-emitter forward voltages of the transistors $Q_8$, $Q_{10}$ and $Q_{11}$ are $V_{BE(Q8)}$, $V_{BE(Q10)}$ and $V_{BE(Q11)}$, respectively, and the emitter voltage of the transistor $Q_8$ is $V_{E(Q8)}(t)$, the transistor $Q_{10}$ is kept off under the following condition:

$$\frac{V_{E(Q8)}(t) - V_h(t)}{R_8 + R_{19}} \cdot R_{19} < V_{BE(Q10)} \quad (1)$$

where, $$V_{E(Q8)}(t) = \frac{R_{10} + R_{11}}{R_9 + R_{10} + R_{11}} \cdot V_{cc}(t) - V_{BE(Q8)}. \quad (2)$$

From equations (1) and (2), the value of the resistor $R_{19}$ is given by, $$R_{19} < \frac{V_{BE(Q10)} \cdot R_8}{V_{E(Q8)}(t) - V_h(t) - V_{BE(Q10)}}$$

Then, $$R_{19} < \frac{V_{BE(Q10)} \cdot R_8}{\frac{R_{10} + R_{11}}{R_9 + R_{10} + R_{11}} V_{cc}(t) - V_h(t) - V_{BE(Q8)} - V_{BE(Q10)}} \quad (3)$$

is obtained.

On the other hand, it is necessary that current flowing through the resistor $R_{19}$ be smaller than current flowing through the resistor $R_8$ in order to ensure that the transistor $Q_{10}$ is turned on when the output terminal g is accidentally grounded during the stationary operation. Namely, $$R_{19} > \frac{V_{BE(Q10)} \cdot R_8}{\frac{R_{10}}{R_9 + R_{10} + R_{11}} V_{cc} - V_{BE(Q8)} - V_{BE(Q10)}} \quad (4)$$

is required. Thus, the resistance of the resistor $R_{19}$ is so selected as to satisfy equations (3) and (4).

The resistor $R_{20}$, which is not significant, simply balances the circuit construction of FIG. 6.

As described above, in order to prevent the erroneous operation of the transistor $Q_{10}$ due to inversion of values of $V_{REF2}$ and $V_h$ immediately after turning-on of the power supply switch or for a time t between $t_1$ and $t_2$, the resistor $R_{19}$ is connected across the base-emitter of the transistor $Q_{10}$ on the condition that the voltage drop across the resistor $R_{19}$ is below the threshold voltage for the transistor $Q_{10}$ and that the value of the resistor $R_{19}$ is so selected as to turn on the transistor $Q_{10}$ when the output terminal g is grounded during the stationary operation. With this construction, not only smooth picture displays can be assured during the transient period ranging from turning-on of the power supply switch to the stationary operation but also the protective operation can fully be accomplished.

Figure 7:
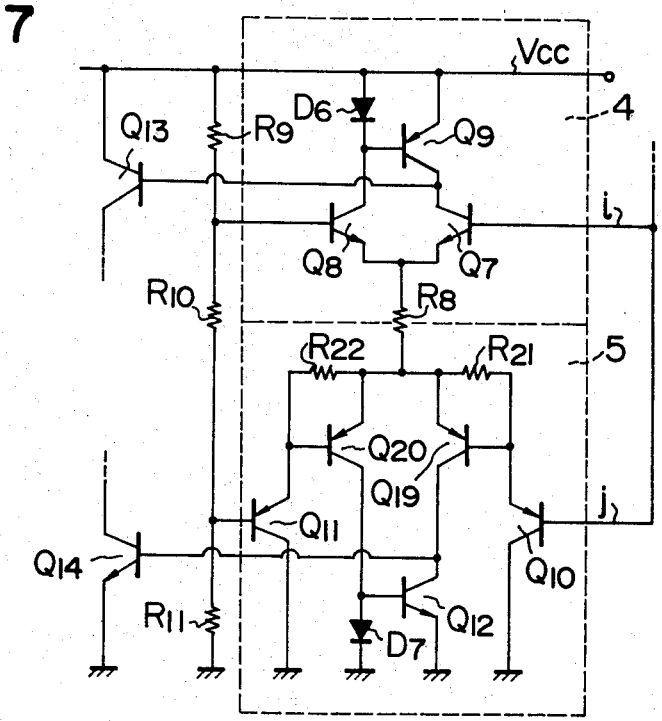
FIGS. 7 and 8 are circuit diagrams of further embodiments of the invention.

FIG. 7 shows further embodiment of the invention. In this embodiment, what is different from the FIG. 6 embodiment is that a differential amplifier for voltage comparator circuit 5 includes transistors $Q_{10}$ and $Q_{19}$, $Q_{11}$ and $Q_{20}$ in Darlington connection, and that a resistor $R_{21}$ is connected across the base-emitter of a second stage transistor $Q_{19}$ in Darlington connection transistors $Q_{10}$ and $Q_{19}$ and a resistor $R_{22}$ is connected across the base-emitter of a second stage transistor $Q_{20}$ in Darlington connection transistors $Q_{11}$ and $Q_{20}$. The FIG. 7 embodiment operates in a similar manner to the FIG. 6 embodiment and attains the same effect. In addition, as compared with the FIG. 6 embodiment, the FIG. 7 embodiment is more advantageous in that the DC current amplification factor of the transistors constituting the differential amplifier can be small because these transistors are in Darlington connection.

Figure 8:
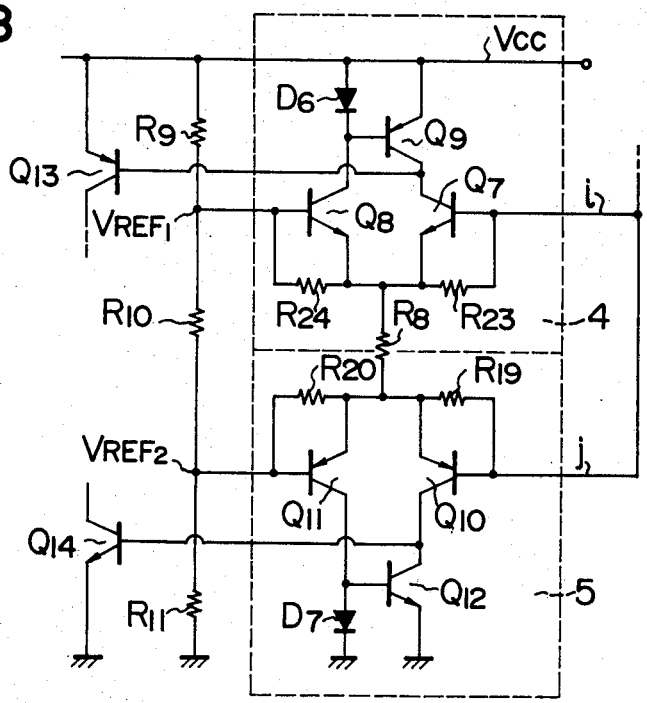

FIG. 8 shows still further embodiment of the invention wherein base-emitter resistors $R_{19}$, $R_{20}$, $R_{23}$ and $R_{24}$ are provided for transistors $Q_7$ and $Q_8$ constituting one voltage comparator circuit 4 and for transistors $Q_{10}$ and $Q_{11}$ constituting the other voltage comparator circuit 5. With the FIG. 8 embodiment, an additional effect can be attained as compared with the FIG. 6 embodiment. More particularly, the output coupling capacitor $C_2$ has a large capacitance as mentioned hereinbefore so that when the power supply switch is turned off, a voltage $V_i$ at point i decreases at a small inclination and the erroneous operation of the protective circuit is caused to appear only one horizontal luminescent line on the screen with fading of normal picture displays when a condition of $V_i > V_{REF1}$ is present. The resistors $R_{23}$ and $R_{24}$ in the FIG. 8 embodiment eliminate such an abnormal phenomenon. Resistances of the resistors $R_{23}$ and $R_{24}$ can be determined in the same manner as in the FIG. 6 embodiment.

Furthermore, as mentioned in the further development of the FIG. 7 embodiment over the FIG. 6 embodiment, the FIG. 8 embodiment may be improved by replacing the transistors $Q_7$ and $Q_8$ and the transistors $Q_{10}$ and $Q_{11}$ for differential amplifiers with Darlington connection transistors and by connecting resistors across the base-emitters of second stage transistors in Darlington connection.

As will be understood from the above, in the FIG. 8 embodiment, the resistor is connected across the base-emitter of each transistor for the differential amplifier constituting the voltage comparator circuit or across the second stage transistor of each Darlington connection transistor circuit so that not only smooth picture display upon turning-on of the power supply switch and disappearance of picture display upon turning-off of the power supply switch can be effected but also component elements constituting the vertical deflection circuit can be protected from damage in the event that the output terminal of the vertical deflection circuit is short-circuited to the power supply line and earth.

While, in the foregoing embodiments, the protective circuit was described as applied to the vertical deflection circuit, it may also be applied to other class B OTL circuits such as sound output circuits. In applications to the sound output circuits, the load $L_1$ stands for a loudspeaker.

Also, it is not always necessary to pick up the detection signal from the junction between the load $L_1$ directly connected to the output terminal and the output coupling capacitor $C_2$. The detection signal is essentially required to be an average of the output signal and therefore, it may be the output signal which has been passed through a filter circuit.

What is claimed is:

1. A protective circuit for preventing breakdown of at least one of output transistors of an OTL circuit, comprising:

a power supply for producing a power supply potential;

a first voltage comparator circuit having one input terminal coupled to receive an output signal of the OTL circuit and another input terminal applied with a first reference voltage which has a preselected relationship to the output signal of the OTL circuit and to the power supply potential and which produces a first comparator output signal in response to a comparison of said output signal with the first reference voltage;

a second voltage comparator circuit having one input terminal coupled to receive the output signal of the OTL circuit and another input terminal applied with a second reference voltage which has a preselected relationship to the output signal of the OTL circuit and to earth potential and which produces a second comparator output signal in response to a comparison of said outpt signal with the second reference voltage;

a control circuit responsive to the first and second comparator output signals for producing a control signal when an output of the OTL circuit is substantially coupled to the power supply potential or earth potential; and a switch circuit operable in response to the control signal for cutting off at least one of the output transistors of the OTL circuit, said switch circuit including a first switching device coupled between the base of one of the output transistors of the OTL circuit and earth potential and a second switching device coupled between the base of the other output transistor of the OTL circuit and earth potential, at least one of said first and second switching devices being rendered conductive when the output of the OTL circuit is substantially coupled to the power supply potential or earth potential, whereby said switch circuit does not affect the normal operation of the OTL circuit and is operated only when the output of the OTL circuit is substantially coupled to the power supply potential or earth potential for preventing breakdown of at least one of the output transistors of the OTL circuit.

2. The protective circuit according to claim 1 wherein the first reference voltage lies between an average voltage of the output signal of the OTL circuit and the power supply potential and the second reference voltage lies between the average and earth potential.

3. The protective circuit according to claim 2 wherein the average voltage appears at a junction between a load directly connected to the output of the OTL circuit and an output coupling capacitor connected in series with the load.

4. In an OTL circuit having a pair of output transistors, a driver transistor, the collector of which is coupled to a base of one output transistor of the OTL circuit and a polarity inversion transistor, the collector of which is coupled to a base of another output transistor of the OTL circuit, a protective circuit for preventing breakdown of at least one of the output transistors of the OTL circuit comprising:

a power supply for producing a power supply potential;

a first voltage comparator circuit having one input terminal coupled to receive an output signal of the OTL circuit and another input terminal applied with a first reference voltage which has a preselected relationship to the output signal of the OTL circuit and to the power supply potential and which produces a first comparator signal in response to a comparison of said output signal with the first reference voltage;

a second voltage comparator circuit having one input terminal coupled to receive the output signal of the OTL circuit and another input terminal applied with a second reference voltage which has a preselected relationship to the output signal of the OTL circuit and to earth potential and which produces a second comparator output signal in response to a comparison of said output signal with the seconnd reference voltage;

a control circuit responsive to the first and second comparator output signals for producing a control signal when the output of the OTL circuit is substantially coupled to the power supply potential or earth potential; and a switch circuit operable in response to the control signal for cutting off at least one of the output transistors of the OTL circuit, said switch circuit including a first transistor having its collector coupled to the collector of the driver transistor of the OTL circuit and its emitter coupled to earth potential and a second transistor having its collector coupled to the collector of the polarity inversion transistor of the OTL circuit and its emitter coupled to earth potential, at least one of said first and second transistors being rendered conductive when the output of the OTL circuit is substantially coupled to the power supply or earth potential, whereby said switch circuit does not affect the normal operation of the OTL circuit and is operated only when the output of the OTL circuit is substantially coupled to the power supply potential or earth potential for preventing breakdown of at least one of the output transistors of the OTL circuit.

5. The protective circuit according to claim 4 wherein the bases of said first and second transistors of the switch circuit are coupled to each other to receive the control signal to cut off output transistors of the OTL circuit simultaneously.

6. The protective circuit according to claim 4 wherein the first reference voltage lies between an average voltage of the output signal of the OTL circuit and the power supply potential and the second reference voltage lies between the average voltage and earth potential.

7. The protective circuit according to claim 6 wherein the average voltage appears at a junction between a load directly connected to the output of the OTL circuit and and output coupling capacitor connected in series with the load.

8. A protective circuit for preventing breakdown of at least one of output transistors of an OTL circuit, comprising:

a power supply for producing a power supply potential;

a first differential amplifier circuit having a first transistor, the base of which is coupled to receive an output signal of the OTL circuit and a second transistor, the base of which is applied with a first reference voltage which has a preselected relationship to the output signal of the OTL circuit and to the power supply potential and which produces a first differential output signal in response to a comparison of said output signal with the first reference voltage;

a second differential amplifier circuit having a third transistor, the base of which is coupled to receive the output signal of the OTL circuit and a fourth transistor, the base of which is applied with a second reference voltage which has a preselected relationship to the output signal of the OTL circuit and to earth potential and which produces a second differential output signal in response to a comparison of said output signal with the second reference voltage;

a resistor connected between the base and emitter of at least one of the transistors in at least one of the first and second differential amplifier circuits;

a control circuit responsive to the first and second differential output signals for producing a control signal when an output of the OTL circuit is substantially coupled to the power supply potential or earth potential; and a switch circuit operable in response to the control signal for cutting off at least one of the output transistors of the OTL circuit, said circuit including a first switching device coupled between the base of one of the output transistors of the OTL circuit and earth potential and a second switching device coupled between the base of the other output transistor of the OTL circuit and earth potential, at least one of said first and second switching devices being rendered conductive when the output of the OTL circuit is substantially coupled to the power supply potential or earth potential, whereby said switch circuit does not affect the normal operation of the OTL circuit and is operated only when the output of the OTL circuit is substantially coupled to the power supply potential or earth potential for preventing breakdown of at least one of the output transistors of the OTL circuit.

9. The protective circuit according to claim 8, wherein the first reference voltage lies between an average voltage of the output signal of the OTL circuit and the power supply potential and the second reference voltage lies between the average voltage and earth potential.

10. The protective circuit according to claim 9 wherein the average voltage appears at a junction between a load directly connected to the output of the OTL circuit and an output coupling capacitor connected in series with the laod.

11. A protective circuit for preventing breakdown of at least one of output transistors of an OTL circuit, comprising:

a power supply for producing a power supply potential;

a first differential amplifier circuit having a first transistor, the base of which is coupled to receive an output signal of the OTL circuit and a second transistor, the base of which is applied with a first reference voltage which has a preselected relationship to the output signal of the OTL circuit and to the power supply potential and which produces a first differential output signal in response to a comparison of said output signal with the first reference voltage;

a second differential amplifier circuit having a third transistor, the base of which is coupled to receive the output signal of the OTL circuit and a fourth transistor, the base of which is applied with a second reference voltage which has a preselected relationship to the output signal of the OTL circuit and to earth potential and which produces a second differential output signal in response to a comparison of said output signal with the second reference voltage;

a resistor connected between the base and emitter of each transistor in at least one of the first and second differential amplifier circuits;

a control circuit responsive to the first and second differential output signals for producing a control signal when an output of the OTL circuit is substantially coupled to the power supply potential or earth potential; and a switch circuit operable in response to the control signal for cutting off at least one of the output signal transistors of the OTL circuit, said switch circuit including a first switchng device coupled between the base of one of the output transistors of the OTL circuit and earth potential and a second switching device coupled between the base of the other output transistor of the OTL circuit and earth potential, at least one of said first and second switching devices being rendered conductive when the output of the OTL circuit is substantially coupled to the power supply potential or earth potential, whereby said switch circuit does not affect the normal operation of the OTL circuit and is operated only when the output of the OTL circuit is substantially coupled to the power supply potential or earth potential for preventing breakdown of at least one of the output transistors of the OTL circuit.

12. A protective circuit for preventing breakdown of at least one of output transistors of an OTL circuit, comprising:

a power supply for producing a power supply potential;

a first differential amplifier circuit having a first transistor, the base of which is coupled to receive an output signal of the OTL circuit and a second transistor, the base of which is applied with a first reference voltage which has a preselected relationship to the output signal of the OTL circuit and to the power supply potential and which produces a first differential output signal in response to a comparison of said output signal with the first reference voltage;

a second differential amplifier circuit having a third transistor, the base of which is coupled to receive the output signal of the OTL circuit and a fourth transistor, the base of which is applied with a second reference voltage which has a preselected relationship to the output signal of the OTL circuit and to earth potential and which produces a second differential output signal in response to a comparison of said output signal with the second reference signal;

a resistor connected between the base and emitter of each of the transistors of each of the first and second differential amplifier circuits;

a control circuit responsive to the first and second differential output signals for producing a control signal when an output of the OTL circuit is substantially coupled to the power supply potential or earth potential; and a switch circuit operable in response to the control signal for cutting off at least one of the output transistors of the OTL circuit, said switch circuit including a first switching device coupled between the base of one of the output transistors of the OTL circuit and earth potential and a second switching device coupled between the base of the other output transistor of the OTL circuit and earth potential, at least one of said first and second switching devices being rendered conductive when the output of the OTL circuit is substantially coupled to the power supply potential or earth potential, whereby said switch circuit does not affect the normal operation of the OTL circuit and is operated only when the output of the OTL circuit is substantially coupled to the power supply potential or earth potential for preventing breakdown of at least one of the output transistors of the OTL circuit.

13. A protective circuit for preventing breakdown of at least one of output transistors of an OTL circuit, comprising:

a power supply for producing a power supply potential;

a first differential amplifier circuit having a first transistor, the base of which is coupled to receive an output signal of the OTL circuit and a second transistor, the base of which is applied with a first reference voltage which has a preselected relationship to the output signal of OTL circuit and to the power supply potential and which produces a first differential output signal in response to a comparison of said output signal with the first reference voltage;

a second differential amplifier circuit having a third transistor, the base of which is coupled to receive the output signal of the OTL circuit and a fourth transistor, the base of which is applied with a second reference voltage which has a preselected relationship to the output signal of the OTL circuit and to earth potential and which produces a second differential output signal in response to a comparison of said output signal with the second reference voltage, at least one of said first and second differential amplifier circuits having Darlington connection transistors and a resistor connected between the base and emitter of a second stage resistor of the Darlington connection transistors;

a control circuit responsive to the first and second differential output signals for producing a control signal when an output of the OTL circuit is substantially coupled to the power supply potential or earth potential; and a switch circuit operable in response to the control signal for cutting off at least one of the output transistors of the OTL circuit, said switch circuit including a first switching device coupled between the base of one of the output transistors of the OTL circuit and earth potential and a second switching device coupled between the base of the other output transistor of the OTL circuit and earth potential, at least one of said first and second switching devices being rendered conductive when the output of the OTL circuit is substantially coupled to the power supply potential or earth potential, whereby said switch circuit does not affect the normal operation of the OTL circuit and is operated only when the output of the OTL circuit is substantially coupled to the power supply potential or earth potential for preventing breakdown of at least one of the output transistors of the OTL circuit.

* * * * *